(12) United States Patent
Lee

(10) Patent No.: US 10,187,018 B2
(45) Date of Patent: Jan. 22, 2019

(54) WIDEBAND HIGHLY LINEAR AMPLIFIER

(71) Applicant: SOLiD, INC., Gyeonggi-do (KR)

(72) Inventor: Hwan Sun Lee, Bucheon-si (KR)

(73) Assignee: SOLiD, INC., Seongnam-si (KR)

( * ) Notice: Subject to any disclaimer, the term of this patent is extended or adjusted under 35 U.S.C. 154(b) by 0 days.

(21) Appl. No.: 15/788,122

(22) Filed: Oct. 19, 2017

(65) Prior Publication Data

US 2018/0048269 A1 Feb. 15, 2018

Related U.S. Application Data

(63) Continuation of application No. 14/411,479, filed as application No. PCT/KR2013/012042 on Dec. 23, 2013, now Pat. No. 9,825,595.

(30) Foreign Application Priority Data

Oct. 11, 2013 (KR) .......................... 10-2013-0121235

(51) Int. Cl.
*H03F 1/32* (2006.01)
*H03F 3/24* (2006.01)
(Continued)

(52) U.S. Cl.
CPC .............. *H03F 1/3247* (2013.01); *H03F 3/19* (2013.01); *H03F 3/24* (2013.01); *H03F 3/245* (2013.01);
(Continued)

(58) Field of Classification Search
CPC . H03F 1/3247; H03F 3/19; H03F 3/24; H03F 3/245; H03F 1/3223; H03F 1/30;
(Continued)

(56) References Cited

U.S. PATENT DOCUMENTS

| 7,015,751 B2 | 3/2006 | Cavers |
| 8,964,892 B2 * | 2/2015 | Hansen ................. H03F 1/3247 375/294 |

(Continued)

FOREIGN PATENT DOCUMENTS

| JP | 2006-128922 A | 5/2006 |
| JP | 2013-021617 A | 1/2013 |

(Continued)

OTHER PUBLICATIONS

International Search Report for PCT/KR2013/012042.

*Primary Examiner* — Khanh V Nguyen
(74) *Attorney, Agent, or Firm* — Sughrue Mion, PLLC

(57) ABSTRACT

A wideband highly linear amplifier includes a plurality of pre-distortion units for respectively linearizing digital signals of a plurality of bands, a synthesis unit for synthesizing output signals of the pre-distortion units, a single amplifier for amplifying signals outputted from the synthesis unit, distribution units for respectively separating the signals for each of the plurality of bands from the output signals of the amplifier, a plurality of inverse compensation attenuators for respectively attenuating the separated signals for each of the plurality of bands, and a feedback path for respectively feeding the attenuated signals for each of the plurality of bands back into the pre-distortion unit of the corresponding band out of the plurality of the pre-distortion units.

14 Claims, 2 Drawing Sheets

(51) Int. Cl.
    *H03F 3/19*    (2006.01)
    *H03F 1/26*    (2006.01)
    *H03F 1/30*    (2006.01)

(52) U.S. Cl.
    CPC .......... *H03F 1/26* (2013.01); *H03F 1/30* (2013.01); *H03F 1/3223* (2013.01); *H03F 2200/111* (2013.01); *H03F 2200/451* (2013.01)

(58) Field of Classification Search
    CPC .......... H03F 1/26; H03F 2200/451; H03F 2200/111; H03F 1/12; H03F 3/211; H03F 3/68; H03F 2200/429; H03F 2200/372; H03F 2201/3206; H03F 1/0288; H03F 1/07; H03F 3/602; H03F 3/605; H03F 3/604; H03G 3/3036; H03G 1/0088; H03G 3/001; H03G 3/10; H03G 3/18; H03G 3/30; H01P 1/22; H03H 7/24
    See application file for complete search history.

(56) References Cited

U.S. PATENT DOCUMENTS

| | | | |
|---|---|---|---|
| 2005/0157814 A1 | 7/2005 | Cova et al. | |
| 2011/0227642 A1* | 9/2011 | Hoyerby | H03F 1/32 330/109 |
| 2014/0347126 A1 | 11/2014 | Laporte | |

FOREIGN PATENT DOCUMENTS

| | | |
|---|---|---|
| KR | 10-2003-0035448 A | 5/2003 |
| KR | 10-2011-0109065 A | 10/2011 |

* cited by examiner

WIDEBAND HIGHLY LINEAR AMPLIFIER

CROSS REFERENCE TO RELATED APPLICATION

This is a Continuation of U.S. application Ser. No. 14/411,479, filed on Dec. 26, 2014, which is a National Stage of International Application No. PCT/KR2013/012042, filed on Dec. 23, 2013, which claims priority from Korean Application No. 10-2013-0121235 filed Oct. 11, 2013, the contents of which are incorporated herein by reference in their entireties.

TECHNICAL FIELD

The present invention relates to a wideband highly linear amplifier for compensating for nonlinear characteristics of a power amplifier in a multi-band system.

BACKGROUND ART

To use linearly a power amplifier, a method of backing off the power amplifier or utilizing a linearizer is applied. However, the back-off method secures the linearity thereof, but has a problem that the output power and efficiency are decreased. Further, since the additional linearizer has a technical limit that it can support a bandwidth just up to a maximum of 100 MHz, the communication equipment such as a distributed antenna system for receiving a plurality of service bands requires the power amplifiers as many as the number of the service bands thereby causing an increase in power consumption, size, price and the like of communication devices.

DISCLOSURE

Technical Problem

The present invention is to provide a wideband highly linear amplifier having high efficiency and high linearity characteristics in a multi-band system.

Further, the present invention is to provide a wideband highly linear amplifier which enables a stable output control for each service, i.e., each band, thereby improving the call quality and maintaining the performance of an entire system.

Further, the present invention is to provide a single wideband highly linear amplifier for providing a pre-distortion technique that compensates for nonlinear characteristics in a transmitter supporting multi-band/multi-mode, thereby enabling a passing multi-band signal to eliminate the interference between the multi-band signals according to the nonlinear characteristics, and enabling each band characteristic to be shared to have a linear characteristic.

Technical Solution

According to an aspect of the present invention, a wideband highly linear amplifier includes: a plurality of pre-distortion units for respectively linearizing digital signals of a plurality of bands; a synthesis unit for synthesizing output signals of the pre-distortion units; a single amplifier for amplifying signals outputted from the synthesis unit; distribution units for respectively separating the signals for each of the plurality of bands from the output signals of the amplifier; a plurality of inverse compensation attenuators for respectively attenuating the separated signals for each of the plurality of bands; and a feedback path for respectively feeding the attenuated signals for each of the plurality of bands back into the pre-distortion unit of the corresponding band out of the plurality of the pre-distortion units.

According to an embodiment, the wideband highly linear amplifier may further include a plurality of attenuators for respectively attenuating signals outputted from the pre-distortion units.

According to another embodiment, the sum of control amounts by the inverse compensation attenuator and the attenuator provided in a same band out of the inverse compensation attenuator and the attenuator may be uniformly controlled so that a loop gain is maintained.

According to still another embodiment, the sum of the control amount by the inverse compensation attenuator and the attenuator may be 30 dB.

According to yet another embodiment, the inverse compensation attenuator and the attenuator may control the output in the range of 0 to 30 dB.

According to still yet another embodiment, the pre-distortion unit may be a digital pre-distortion unit having a crest factor reduction (CFR) function.

According to further embodiment, the distribution unit may separate the signals for each of the plurality of bands so that the signals have a band at least twice the size of each band.

According to another further embodiment, the amplifier may be a nitride (GaN) amplifier.

Advantageous Effects

According to the preferred embodiments of the present invention, the present invention enables the inverse compensation via the feedback loop thereby performing a stable control of the output for each band, maintaining the performance of the entire system and improving the call quality.

According to the preferred embodiments of the present invention, in processing signals of a multi-band, since the single amplifier is used, it enables a reduction in the size thereof and has high efficiency and highly linear characteristics.

BEST MODE FOR THE INVENTION

The present invention may be changed in various forms and embodied in different forms, and thus exemplary embodiments of the present invention will be described below in more detail with reference to the accompanying drawings. However, it will be understood that present description is not intended to limit the invention to those exemplary embodiments. On the contrary, the invention is intended to cover not only the exemplary embodiments, but also various alternatives, modifications, equivalents and other embodiments, which may be included within the sprit and scope of the invention.

Detailed descriptions of known functions and configurations which have been deemed to make the gist of the present invention unnecessarily obscure will be omitted below. Further, the numbers (e.g., the first, second, etc.) used in the course of being described in the specification are used just to distinguish one component from the other components.

Further, in this specification, when referred to as one component "is connected to" or "is accessed to" the other component, it may be understood that the one component is connected directly to the other components, but, as long as any particular descriptions to the contrary are not made, it should be understood that the one component may be connected or accessed to the other component via another component in the middle thereof.

Hereinafter, exemplary embodiments will be described in detail with reference to the accompanying drawings.

Figure 1:
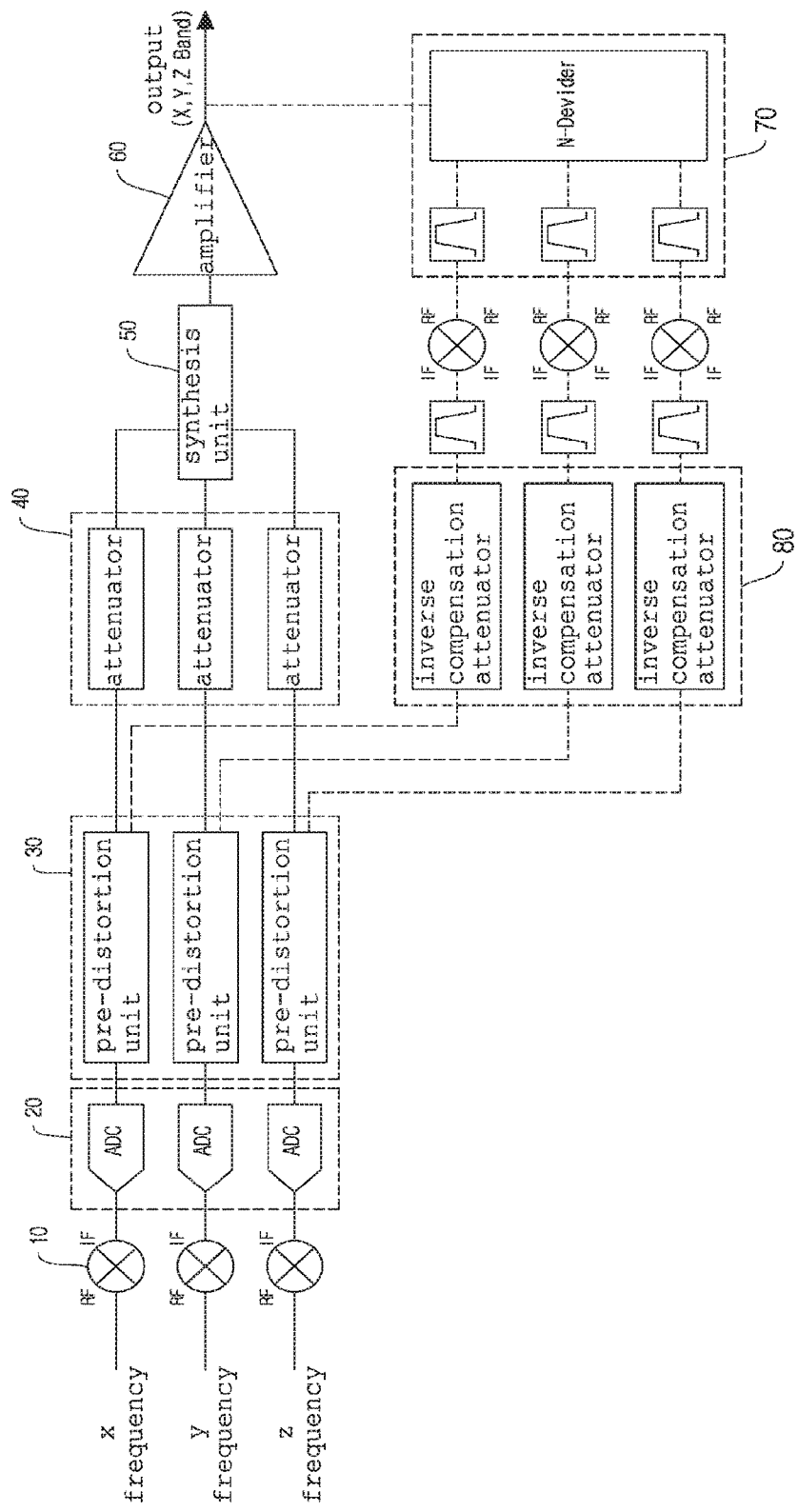
FIG. 1 is a block diagram showing a wideband highly linear amplifier according to an embodiment of the present invention.

The wideband highly linear amplifier according to one embodiment of the present invention will be described with reference to FIG. 1. FIG. 1 is a block diagram showing the wideband highly linear amplifier according to one embodiment of the present invention.

The wideband highly linear amplifier according to the present embodiment is provided with an amplification path for amplifying signals, and is provided with a feedback path for feeding back a portion of the output signals. As shown in FIG. 1, the path for amplification is provided with pre-distortion units 30, attenuators 40, a synthesis unit 50, and an amplifier 60, and the path for feedback includes distribution units 70 and inverse compensation attenuators 80.

Specifically, the wideband highly linear amplifier according to the present embodiment may amplify the signals of multi bands. For example, as shown in FIG. 1, three bands of x, y and z, e.g., three types of services may be provided.

The signals of each band are mixed with a local oscillation frequency in the mixer 10 provided for each band thereby being converted into an intermediate frequency signal. The signal having been converted into the intermediate frequency signal is then converted into a digital signal through the analog/digital converter 20 provided for each band.

The pre-distortion units 30 are provided in the number corresponding to the plurality of bands described above, each of which performs the linearization of the digital signal for each band. In the case of high-power amplifier, it operates in a saturation point, and a nonlinear distortion is thereby generated to cause distortion of signal, thus affecting an adjacent channel. The pre-distortion unit 30 performs a linearization technique in order to minimize the amplitude distortion and phase distortion of the signal and the influence of the adjacent channels caused by the nonlinear characteristic of the amplifier.

The pre-distortion unit 30 serves to create an inter-modulation distortion signal having been reverse-phased and input it to the amplifier. The inputted signal reverse-phased is synthesized with the inter-modulation distortion signal outputted from the amplifier and then removed.

On the other hand, the pre-distortion unit 30 according to this embodiment is provided with a digital pre-distortion (PDP) device with a crest factor reduction (CFR) function. The pre-distortion unit 30 may be adapted even to any environmental changes to maintain its characteristics, through the digital pre-distortion device with the crest factor reduction function received with the inter-modulation distortion signal through the feedback path.

The attenuator 40 is provided with the number corresponding to the plurality of bands described above, and attenuates the digital signal for each band outputted from the pre-distortion unit 30.

The synthesis unit 50 synthesizes the signals for each band outputted through the pre-distortion 30 and the attenuator 40 as one signal.

The amplifier 60 amplifies and outputs the signal synthesized as one by the synthesis unit 50. That is, in the amplifier 60, the signals of x, y, z bands are amplified in the synthesized state and outputted.

There amplifier 60 according to this embodiment may be an amplifier using a high power nitride transistor (GaN Transistor). In the case of the nitride transistor, it is 10 times higher in its power density than the existing Si-based LDMOS transistor and has an excellent wideband characteristic. By using the GaN Transistor for high power, it is possible to miniaturize the product and achieve a weight reduction of 30% or more.

Incidentally, a portion of the amplified and synthesized signals is, as described previously, fed back to the pre-distortion unit 30 through the distribution unit 70 and the inverse compensation attenuator 80.

In the case where the feedback path is not provided, the characteristic change of the amplifier may occur severely at a time of temperature change and control of changing input level and output level.

The wideband highly linear amplifier according to the present embodiment performs an inverse compensation through the feedback loop structure described above thereby having an effect of maintaining the characteristics of the amplifier so that the characteristics may not be changed as far as possible even when the environment is changed or a control of changing input and output levels is performed.

More specifically, the distribution unit 70 separates again the signals for each of the plurality of bands from the output signals of the amplifier 60. The distribution unit 70 may redistribute for each band the signals outputted through the amplifier 60 by performing filtering using a filter or the like corresponding to each band after separating the signals.

Further, it is possible for the distribution unit 70 to separate the signals to have a band approximately twice the size of each band when separating the signals for each of the plurality of bands. If the signals are separated so as to have the band approximately twice the size of each band, it is effective to improve the performance reduction due to a third harmonic current (IM).

The signals separated for each band are inputted to each of the inverse compensation attenuator 80 provided by the number of bands. The inverse compensation attenuator 80 attenuates the signals for each band output from the distribution unit 70.

At this time, it is preferable that the inverse compensation attenuator 80 control the output signals in the range of less than 30 dB, and it is preferable to maintain uniformly the sum of the control amount of the inverse compensation attenuator 80 and the control amount of the attenuator 80 described previously. By maintaining uniformly the sum of the control amount of the inverse compensation attenuator 80 and the control amount of the attenuator 80 described previously, it is possible to maintain the loop gain returned to the pre-distortion unit 30 by way of the amplifier 60.

As such, in the case where the inverse compensation attenuator 80 is not provided for each band, it is not able to adjust the output of the amplifier 60 for each band. In addition, even though the attenuator for each band is applied to the front end of the pre-distortion unit 30, the digital pre-distortion unit deteriorates in the signal to noise ratio (S/N) thereby having a big effect on the call quality at the time an attenuation of 10 dB or more occurs, because of the technical limitations of dynamic range of the analog/digital converter.

As such, since the attenuator 40 is provided at the front end of the amplifier 60 and the inverse compensation attenuator 80 is provided to the feedback path thereby enabling the inter-inverse compensation, it is possible to stably adjust the output of the amplifier 60 for each band by maintaining the loop gain and it is possible to adjust the output of the amplifier 60 for each band by 30 dB or more.

Further, in addition to the feedback structure including the attenuator 40 enabling the inter-inverse compensation and the inverse compensation attenuator 80, since the digital pre-distortion device (DPD) having the crest factor reduction (CFR) function is provided, it is possible to positively adapt to any environmental changes thereby maintaining the characteristics of the wideband highly linear amplifier.

Figure 2:
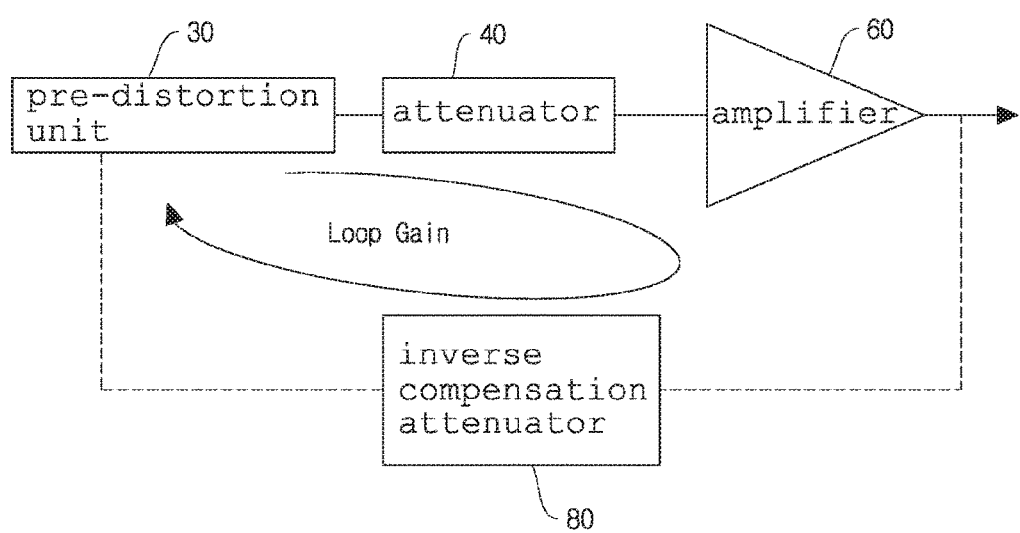
FIG. 2 is a block diagram a feedback loop included in the wideband highly linear amplifier according to an embodiment of the present invention.

The characteristics of the wideband highly linear amplifier according to an embodiment of the present invention will be described with reference to FIGS. 1 and 2. FIG. 2 is a block diagram showing the feedback loop included in the wideband highly linear amplifier according to an embodiment of the present invention.

The signals for each of the plurality of services with different bands are linearization-compensated through the pre-distortion unit 30, respectively, and then combined into one signal to be amplified as a required output through the single of amplifier 60.

The signal which is amplified and output from the amplifier 60 is again separated into the signal for each band through the distribution unit 70 on the feedback path and then transferred again to the pre-distortion unit 30 via the inverse compensation attenuator 80. Due to such structure, in spite of external environmental changes or changes caused by input and output control, it is possible to maintain the linearity thereof. In addition, it is possible to control the output for each band of each service through the inter-inverse compensation attenuating process of the attenuator 40 and the inverse compensation attenuator 80.

Meanwhile, as described above, it is preferable to uniformly maintain the sum of the control amount of the inverse compensation attenuator 80 and the control amount of the attenuator 40. Table 1 below indicates the inter-inverse compensation attenuating operation.

TABLE 1

| Attenuator | Inverse compensation attenuator | Sum |
|---|---|---|
| 0 | 30 | 30 |
| 1 | 29 | 30 |
| 2 | 28 | 30 |
| ~ | ~ | ~ |
| 30 | 0 | 30 |

The attenuator 30 and the inverse compensation attenuator 80 may be controlled in the range of 0 to 30 dB. In the case where the control amount of the attenuator 30 is 1 dB, the control amount of the inverse compensation attenuator 80 is controlled as 29 dB so that the sum of the control amount of the inverse compensation attenuator 80 and the control amount of the attenuator 40 becomes 30 dB.

Referring to FIG. 2, the pre-distortion unit 30, the route connecting the attenuator 40, the amplifier 60 and the inverse compensation attenuator 80 forms a single loop. At this time, since the sum of the control amount of the inverse compensation attenuator 80 and the control amount of the attenuator 40 as described previously is maintained uniformly, the loop gain returning to the pre-distortion unit 30 via the amplifier 60 may be uniformly maintained.

When the gain of the route from the pre-distortion unit to the feedback path is changed through an external environment and a control, difference in the exact inverse compensation for the AM-AM characteristic of the amplifier is generated thereby causing the performance degradation. Accordingly, if the output control is performed for each service without the inter-inverse compensation attenuating process, it may affect the call quality.

While the present invention has been described with respect to the specific embodiments, it will be apparent to those skilled in the art that various changes and modifications may be made without departing from the spirit and scope of the invention as defined in the following claims.

The invention claimed is:

1. An amplification system, comprising:
   a plurality of first attenuators, each of the first attenuators attenuating a corresponding one of linearized signals of a plurality of bands;
   a combining unit for combining output signals of the first attenuators;
   an amplifier for amplifying an output signal of the combining unit;
   a separation unit for separating an output signal of the amplifier for each of the plurality of bands; and
   a plurality of second attenuators, each of the second attenuators attenuating a corresponding one of the separated signals for each of the plurality of bands.

2. The amplification system of claim 1, further comprising:
   a linearizer for linearizing signals of the plurality of bands.

3. The amplification system of claim 2, wherein the linearizer is a digital pre-distorter having a crest factor reduction (CFR) function.

4. The amplification system of claim 2, further comprising:
   a feedback path for feeding each of output signals of the plurality of second attenuators back into the linearizer.

5. The amplification system of claim 1, wherein a sum of control amounts of a first attenuator and a second attenuator provided in a same band among the first attenuators and the second attenuators is uniformly controlled so that a loop gain is maintained.

6. The amplification system of claim 5, wherein the sum of the control amounts of the first attenuator and the second attenuator is about 30 dB.

7. The amplification system of claim 6, wherein the first attenuator and the second attenuator control an output in a range of about 0 to about 30 dB.

8. The amplification system of claim 1, wherein the separation unit separates the output signal of the amplifier for each of the plurality of bands so that the separated signals have a band at least twice a size of each band.

9. The amplification system of claim 1, wherein the amplifier is a gallium nitride (GaN) amplifier.

10. An amplification system, comprising:
    a first attenuation unit for attenuating linearized signals of a plurality of bands;
    a combining unit for combining output signals of the first attenuation unit;
    an amplifier for amplifying an output signal of the combining unit; and
    a second attenuation unit for attenuating an output signal of the amplifier, wherein a sum of control amounts of the first attenuation unit and the second attenuation unit is uniformly controlled so that a loop gain is maintained.

11. The amplification system of claim 10, further comprising:
   a linearizer for linearizing signals of the plurality of bands.

12. The amplification system of claim 11, further comprising:
   a feedback path for feeding an output signal of the second attenuation unit back into the linearizer.

13. The amplification system of claim 10, wherein the sum of the control amounts of the first attenuation unit and the second attenuation unit is about 30 dB.

14. The amplification system of claim 13, wherein the first attenuation unit and the second attenuation unit control an output in a range of about 0 to about 30 dB.

* * * * *